(12) United States Patent
Zhou et al.

(10) Patent No.: US 10,243,155 B2
(45) Date of Patent: Mar. 26, 2019

(54) GROOVE STRUCTURE EMPLOYED FOR PRINTING FILM FORMATION AND MANUFACTURE METHOD THEREOF

(71) Applicant: Shenzhen China Star Optoelectronics Technology Co., Ltd., Shenzhen (CN)

(72) Inventors: Xingyu Zhou, Shenzhen (CN); Weijing Zeng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 220 days.

(21) Appl. No.: 15/121,034

(22) PCT Filed: Jun. 21, 2016

(86) PCT No.: PCT/CN2016/086545
§ 371 (c)(1),
(2) Date: Aug. 24, 2016

(87) PCT Pub. No.: WO2017/206206
PCT Pub. Date: Dec. 7, 2017

(65) Prior Publication Data
US 2018/0205026 A1    Jul. 19, 2018

(30) Foreign Application Priority Data

May 30, 2016  (CN) .......................... 2016 1 0370767

(51) Int. Cl.
*H01L 51/00*    (2006.01)
*H01L 51/56*    (2006.01)
(Continued)

(52) U.S. Cl.
CPC ...... *H01L 51/0096* (2013.01); *H01L 51/0003* (2013.01); *H01L 51/0005* (2013.01);
(Continued)

(58) Field of Classification Search
CPC ............. H01L 27/3246; H01L 27/3218; H01L 51/0005
See application file for complete search history.

(56) References Cited

U.S. PATENT DOCUMENTS

| 2009/0070995 | A1* | 3/2009 | Kumagai | ............ H01L 51/0004 29/846 |
| 2012/0049210 | A1 | 3/2012 | Takagi | |
| 2015/0028310 | A1* | 1/2015 | Dai | ..................... H01L 27/3246 257/40 |

* cited by examiner

*Primary Examiner* — Changhyun Yi
(74) *Attorney, Agent, or Firm* — Leong C. Lei (57) ABSTRACT

The present invention provides a groove structure employed for printing film formation, wherein the groove structure is located on a substrate, comprises a dam and a groove formed by the dam surrounding, and the dam comprises at least two layers of branch dam layers, which are stacked up, and material of the branch dam layers is silicon nitride or silicon oxide, and material of a top side branch dam layer is silicon oxide, wherein the inclined circumferential surface of the groove, which is surrounded by the branch dam layer manufactured with silicon oxide and the upper surface of the top side branch dam layer are hydrophobic surfaces, and an inclined circumferential surface of the groove, which is surrounded by the branch dam layer manufactured with silicon nitride, is a hydrophilic surface.

11 Claims, 6 Drawing Sheets

(51) Int. Cl.
*H01L 51/50* (2006.01)
*H01L 51/52* (2006.01)
*H01L 27/32* (2006.01)

(52) U.S. Cl.
CPC ...... *H01L 51/5056* (2013.01); *H01L 51/5072* (2013.01); *H01L 51/5206* (2013.01); *H01L 51/56* (2013.01); *H01L 27/3244* (2013.01)

GROOVE STRUCTURE EMPLOYED FOR PRINTING FILM FORMATION AND MANUFACTURE METHOD THEREOF

FIELD OF THE INVENTION

The present invention relates to a display technology field, and more particularly to a groove structure employed for printing film formation and a manufacture method thereof.

BACKGROUND OF THE INVENTION

The Organic Light Emitting Display (OLED) Element possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The structure of the OLED display element generally comprises: a substrate, an anode, a cathode and an organic function layer sandwiched between the anode and the cathode. The organic function layer generally comprises a Hole Transport Layer (HTL), an Emissive Layer (EML), and an Electron Transport Layer (ETL). Each function layer can be one layer, or more than one layer. For instance, the Hole Transport Layer can be subdivided into a Hole Injection Layer (HIL) and a Hole Transporting Layer; the Electron Transport Layer can be subdivided into an Electron Transporting Layer and an Electron Injection Layer (EIL). The principle of the OLED is that the illumination generates due to the carrier injection and recombination under the electric field driving of the semiconductor material and the organic semiconductor illuminating material.

Generally, the manufacture method of the OLED display element is forming an anode on the substrate, and forming a Hole Transport Layer on the anode, and forming an Emissive Layer on the Hole Transport Layer, and forming an Electron Transport Layer on the Emissive Layer, and forming a cathode on the Electron Transport Layer, wherein material of the cathode and the anode generally utilizes the Indium Tin Oxide (ITO). The manufacture of the function layers of HTL, EML, ETL generally includes two kinds, the Vacuum Thermal Evaporation and the Ink-jet Print (IJP).

In the manufacture of organic function layer of the AMOLED element, the Ink-jet Print has advantages of material saving, mild process condition, more uniform film formation, and thus possesses more application potentials. IJP is to directly drop coat the ink with OLED material into the pre made pixel definition layer, and the required pattern is formed after the solvent is evaporated. The pixel definition layer comprises a dam, and a plurality of grooves formed by the dam surrounding and aligned in array. The grooves are employed to restrain the ink, and with drying and baking, the ink shrinks in the area restricted by the grooves and the thin films are formed. Because the OLED light emitting material has many layers, and the hydrophilic-hydrophobic properties of the inks employed for all layers are different. As printing the different OLED layers, the requirements to the hydrophilic-hydrophobic properties of the dam lateral sides are different. For the hydrophobic ink, it requires that the dam lateral side possesses a certain hydrophily to prevent that the contact angle is over large to result in the thinner edge film thickness; vice versa, for the hydrophilic ink, it requires that the dam lateral side possesses a certain hydrophoby to prevent that the contact angle is over small to result in the thicker edge film thickness. On the other sides, the upper surface of the dam generally needs to be hydrophobic to avoid the remain of the ink to make the ink all flow into the groove. However, it is very difficult to achieve the aforesaid objective with only one material to manufacture the dam.

SUMMARY OF THE INVENTION

An objective of the present invention is to provide a groove structure employed for printing film formation, in which with the surfaces of different hydrophilic-hydrophobic properties, the nonuniform film thickness caused after the solvent evaporation can be prevented.

Another objective of the present invention is to provide a manufacture method of a groove structure employed for printing film formation, in which with the surfaces of different hydrophilic-hydrophobic properties, the nonuniform film thickness caused after the solvent evaporation can be prevented.

For realizing the aforesaid objectives, the present invention provides a groove structure employed for printing film formation, wherein the groove structure is located on a substrate, and comprises a dam and a groove formed by the dam surrounding;

the dam comprises at least two layers of branch dam layers, which are stacked up;

material of the branch dam layers is silicon nitride or silicon oxide, and materials of two layers of branch dam layers, which are adjacent, are different, and material of a top side branch dam layer is silicon oxide;

an inclined circumferential surface of the groove, which is surrounded by the branch dam layer manufactured with silicon oxide, and an upper surface of the top side branch dam layer are hydrophobic surfaces;

an inclined circumferential surface of the groove, which is surrounded by the branch dam layer manufactured with silicon nitride, is a hydrophilic surface.

The inclined circumferential surface of the groove, which is surrounded by the branch dam layer manufactured with silicon oxide and the upper surface of the top side branch dam layer are covered with monomer silane reagent.

The dam comprises four layers of branch dam layers, which are stacked up.

The groove structure is employed for printing film formation of an organic function layer of an OLED display element, and the substrate comprises a first electrode, and the dam surrounding to form the groove is located at periphery edges of the first electrode and on the substrate.

The present invention further provides a manufacture method of a groove structure employed for printing film formation, comprising steps of:

step 1, providing a substrate, and sequentially forming at least two layers of branch dam layers, which are stacked up on the substrate by coating, drying and etching to form a dam, and the dam surrounds to form a groove;

material of the branch dam layers is silicon nitride or silicon oxide, and materials of two layers of branch dam layers, which are adjacent, are different, and material of a top side branch dam layer is silicon oxide;

step 2, implementing oxygen plasma process to the respective branch dam layers to enhance hydrophilies of surfaces of the respective branch dam layers;

step 3, employing silane reagent to implement monomer self assembly to the respective branch dam layers to make an inclined circumferential surface of the groove, which is surrounded by the branch dam layer manufactured with silicon oxide, and an upper surface of the top side branch dam layer become hydrophobic surfaces.

In the step 1, the substrate comprises a first electrode, and the dam surrounding to form the groove is located at periphery edges of the first electrode and on the substrate.

In the step 3, by positioning the substrate into a closed vessel, and vacuuming the closed vessel and then supplying silane reagent gas into the same to make monomer self assembly generate to the branch dam layer manufacture with silicon oxide and the silane reagent.

In the step 3, solution containing the silane reagent is drop coated on the substrate to make monomer self assembly generate to the branch dam layer manufacture with silicon oxide and the silane reagent.

The manufacture method further comprises step 4, baking and cleaning the substrate.

The present invention further provides a manufacture method of a groove structure employed for printing film formation, comprising steps of:

step 1, providing a substrate, and sequentially forming at least two layers of branch dam layers, which are stacked up on the substrate by coating, drying and etching to form a dam, and the dam surrounds to form a groove;

material of the branch dam layers is silicon nitride or silicon oxide, and materials of two layers of branch dam layers, which are adjacent, are different, and material of a top side branch dam layer is silicon oxide;

step 2, implementing oxygen plasma process to the respective branch dam layers to enhance hydrophilies of surfaces of the respective branch dam layers;

step 3, employing silane reagent to implement monomer self assembly to the respective branch dam layers to make an inclined circumferential surface of the groove, which is surrounded by the branch dam layer manufactured with silicon oxide, and an upper surface of the top side branch dam layer become hydrophobic surfaces;

wherein in the step 1, the substrate comprises a first electrode, and the dam surrounding to form the groove is located at periphery edges of the first electrode and on the substrate;

step 4, baking and cleaning the substrate.

The benefits of the present invention are: the present invention provides a groove structure employed for printing film formation, wherein the groove structure is located on a substrate, and comprises a dam and a groove formed by the dam surrounding, and the dam comprises at least two layers of branch dam layers, which are stacked up, and material of the branch dam layers is silicon nitride or silicon oxide, and materials of two layers of branch dam layers, which are adjacent, are different, and material of a top side branch dam layer is silicon oxide, and the inclined circumferential surface of the groove, which is surrounded by the branch dam layer manufactured with silicon oxide and the upper surface of the top side branch dam layer are covered with monomer silane reagent to become hydrophobic surfaces, and an inclined circumferential surface of the groove, which is surrounded by the branch dam layer manufactured with silicon nitride, is a hydrophilic surface. While performing printing film formation, the upper surface of the top side branch dam layer is hydrophobic to make that the ink can better get inside the groove, and does not remain on the surface. According to the different hydrophilic-hydrophobic properties of each layer of material ink, the surfaces having different hydrophilic-hydrophobic properties can be correspondingly selected to reasonably adjust the contact angle of the ink and the contact surface, and can prevent the nonuniform film thickness caused after the solvent evaporation.

The present invention provides a manufacture method of a groove structure employed for printing film formation, in which with the surfaces of different hydrophilic-hydrophobic properties, the nonuniform film thickness caused after the solvent evaporation can be prevented.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 5:
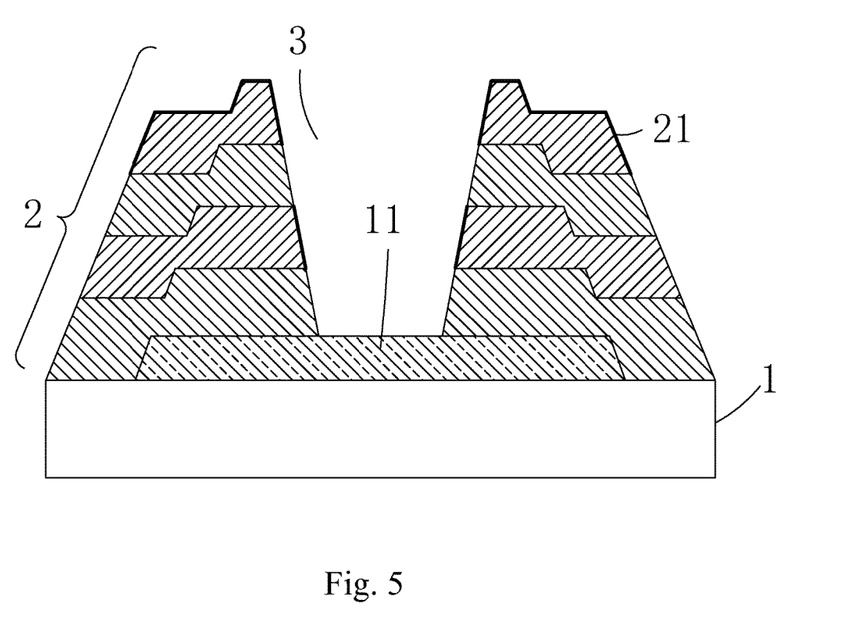
FIG. 5 is a diagram of the groove structure employed for printing film formation according to the present invention.

Please refer to FIG. 5. The present invention provides a groove structure employed for printing film formation, wherein the groove structure is located on a substrate 1, and comprises a dam 2 and a groove 3 formed by the dam 2 surrounding.

Specifically, the dam 2 comprises at least two layers of branch dam layers 21, which are stacked up, and material of the branch dam layers 21 is silicon nitride or silicon oxide, and materials of two layers of branch dam layers 21, which are adjacent, are different, and material of a top side branch dam layer 21 is silicon oxide.

An inclined circumferential surface of the groove 3, which is surrounded by the branch dam layer 21 manufactured with silicon oxide, and an upper surface of the top side branch dam layer 21 are hydrophobic surfaces.

Specifically, the inclined circumferential surface of the groove 3, which is surrounded by the branch dam layer 21 manufactured with silicon oxide and the upper surface of the top side branch dam layer 21 are covered with monomer silane reagent. The monomer self assembly generates by utilizing the silane reagent and the hydroxyl silicon (Si—OH) to form hydrophobic surfaces. The monomer film formed after the self assembly can be identified by observing the surface roughness and the density with the Scan Electron Microscope (SEM) and the Atomic Force Microscope (AFM). Besides, the properties also can be found with the Scanning Tunneling Microscope (STM) or the infrared spectrum.

Furthermore, the composition of the silane reagent is $X_3SiY$, wherein X is a hydrolyzable group, including: chloro (Cl), methoxy group (OMe), oxethyl group (OEt), or methoxyl oxethyl group (OC2H4OCH3), and Y is a non-hydrolyzable group, including: one or more combinations of alkyl group containing 6 to 20 carbon atoms and aryl group containing 6 to 20 carbon atoms.

Specifically, an inclined circumferential surface of the groove 3, which is surrounded by the branch dam layer 21 manufactured with silicon nitride, is a hydrophilic surface, and the hydrophily of surface can be enhanced in advance with oxygen plasma ($O_2$ Plasma) process.

Specifically, the surface of the branch dam layer 21 manufactured with silicon nitride and the surface of the branch dam layer 21 manufactured with silicon oxide have different hydrophilic-hydrophobic properties. Thus, in the solution film formation, the inks having different hydrophilic-hydrophobic properties can be correspondingly selected to adjust the contact angle of the ink and the contact surface, and can prevent the nonuniform film thickness caused after the solvent evaporation.

Specifically, the amount of the branch dam layers 21 in the dam 2 is not limited. Preferably, the dam 2 comprises four layers of branch dam layers 21, which are stacked up.

Furthermore, the groove structure can be employed for printing film formation of an organic function layer of an OLED display element, and the substrate 1 comprises a first electrode 11, and the dam 2 surrounding to form the groove 3 is located at periphery edges of the first electrode 11 and on the substrate 1, and the Hole Injection layer, the Emissive Layer and the Electron Transport Layer are manufacture in the dam 3, and a second electrode covers on the Electron Transport Layer. The first electrode 11 and the second electrode respectively are the anode and the cathode of the OLED display element.

Figure 1:
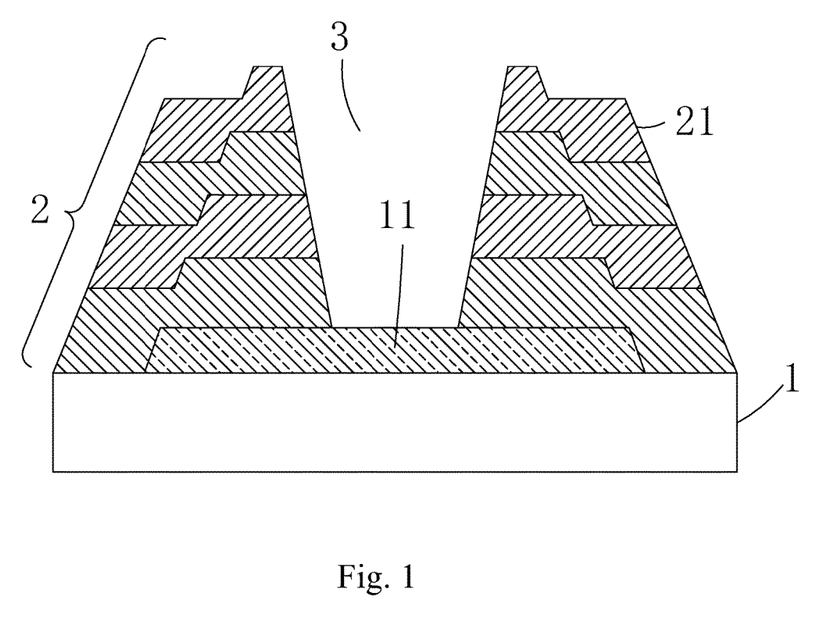
FIG. 1 is a diagram of the step 1 in the manufacture method of the groove structure employed for printing film formation according to the present invention.
Figure 6:
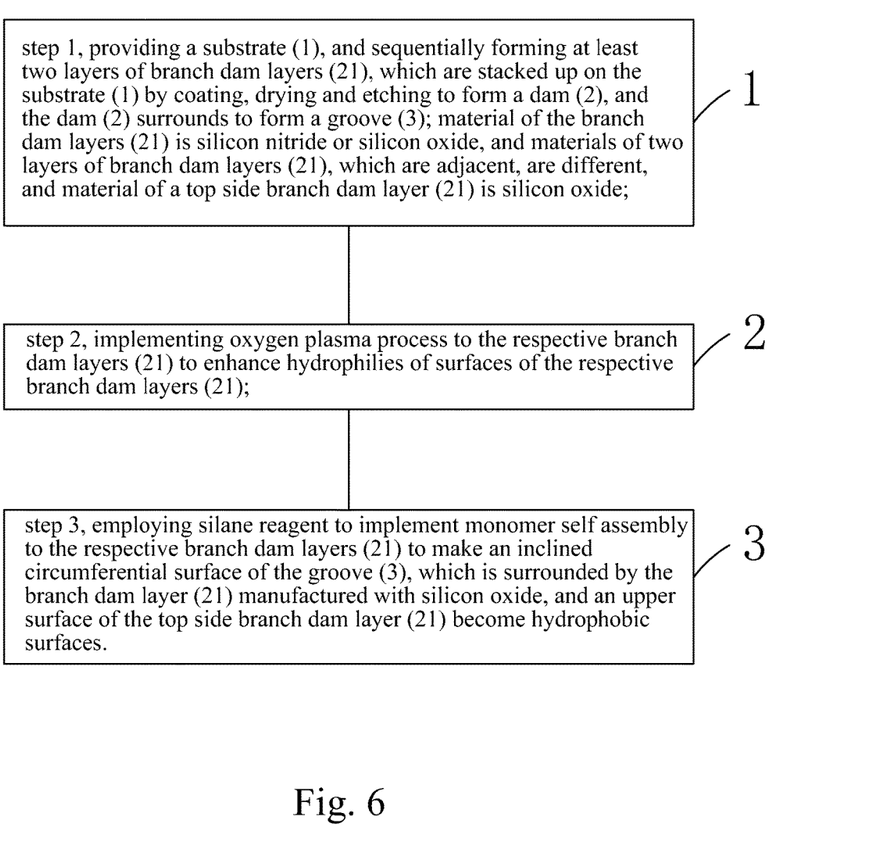
FIG. 6 is a flowchart of the manufacture method of the groove structure employed for printing film formation according to the present invention.

Please refer to FIG. 6. The present invention further provides a manufacture method of a groove structure employed for printing film formation, comprising steps of:

step 1, referring to FIG. 1, providing a substrate 1, and sequentially forming at least two layers of branch dam layers 21, which are stacked up on the substrate 1 by coating, drying and etching to form a dam 2, and the dam 2 surrounds to form a groove 3;

material of the branch dam layers 21 is silicon nitride or silicon oxide, and materials of two layers of branch dam layers 21, which are adjacent, are different, and material of a top side branch dam layer 21 is silicon oxide.

Specifically, the amount of the branch dam layers 21 in the dam 2 is not limited. Preferably, the dam 2 comprises four layers of branch dam layers 21, which are stacked up, and materials from bottom to top respectively are, silicon nitride, silicon oxide, silicon nitride and silicon oxide.

Figure 2:
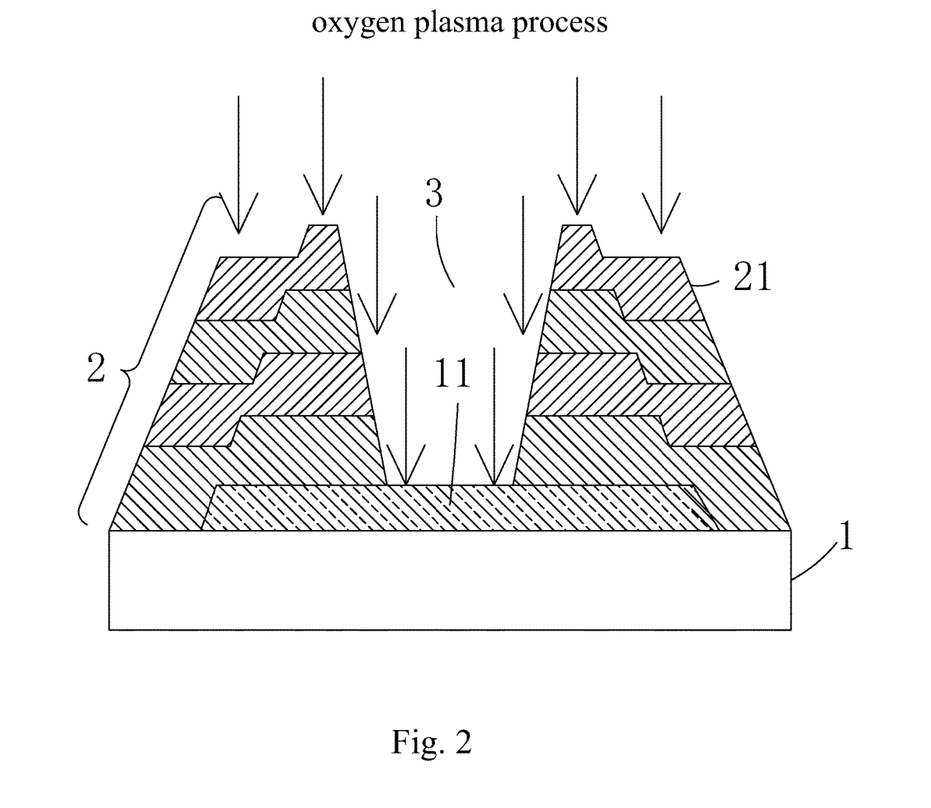
FIG. 2 is a diagram of the step 2 in the manufacture method of the groove structure employed for printing film formation according to the present invention.

Furthermore, in the step 1, the substrate 1 comprises a first electrode 11, and the dam 2 surrounding to form the groove 3 is located at periphery edges of the first electrode 11 and on the substrate 1.

step 2, referring to FIG. 2, implementing oxygen plasma process to the respective branch dam layers 21 to enhance hydrophilies of surfaces of the respective branch dam layers 21.

Specifically, with the oxygen plasma process, the hydrophilies of surfaces of the branch dam layers 21 manufactured with silicon nitride and the branch dam layers 21 manufactured with silicon oxide can be enhanced so that in the following steps, the hydrophilic-hydrophobic property difference of the branch dam layers 21 manufactured with silicon nitride and the branch dam layers 21 manufactured with silicon oxide can be increased.

step 3, referring to FIG. 5, employing silane reagent to implement monomer self assembly to the respective branch dam layers 21 to make an inclined circumferential surface of the groove 3, which is surrounded by the branch dam layer 21 manufactured with silicon oxide, and an upper surface of the top side branch dam layer 21 become hydrophobic surfaces.

Figure 3:
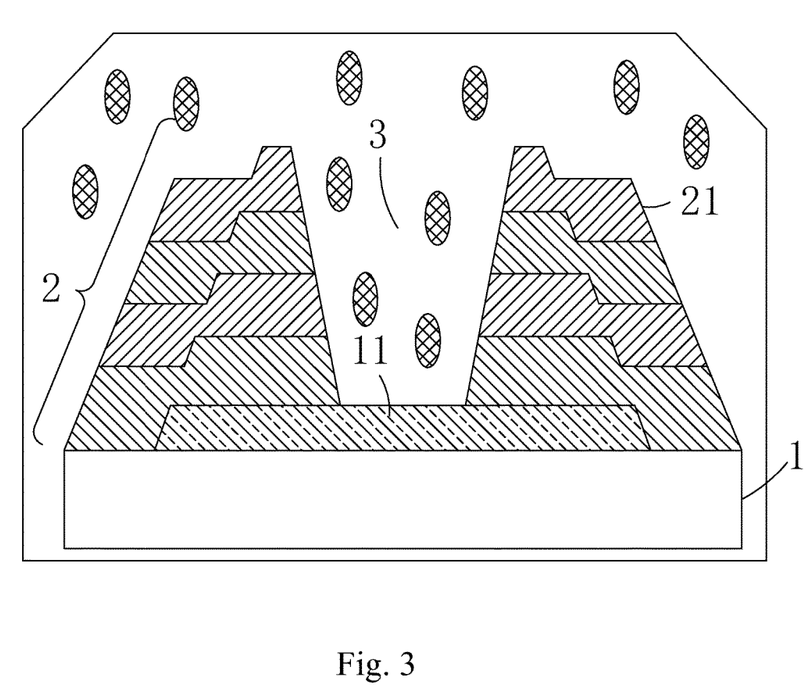
FIG. 3 is a diagram of the step 3 of the first embodiment in the manufacture method of the groove structure employed for printing film formation according to the present invention.

Selectably, referring to FIG. 3, in the step 3, by positioning the substrate 1 into a closed vessel, and vacuuming the closed vessel and then supplying silane reagent gas into the same to make monomer self assembly generate to the branch dam layer 21 manufacture with silicon oxide and the silane reagent.

Figure 4:
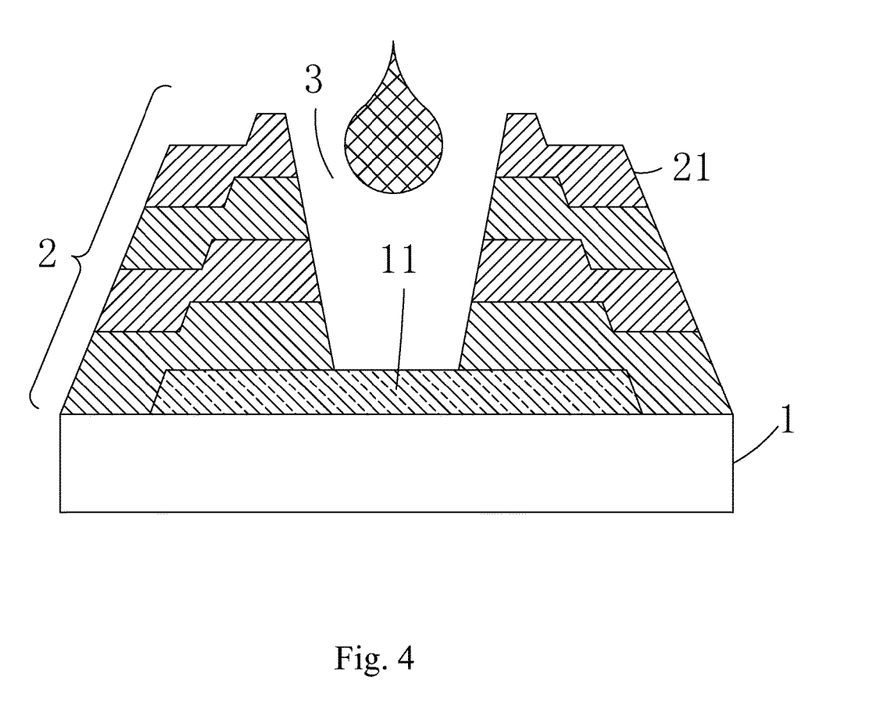
FIG. 4 is a diagram of the step 3 of the second embodiment in the manufacture method of the groove structure employed for printing film formation according to the present invention.

Selectably, referring to FIG. 4, in the step 3, solution containing the silane reagent is drop coated on the substrate 1 to make monomer self assembly generate to the branch dam layer 21 manufacture with silicon oxide and the silane reagent.

Specifically, the surface of the branch dam layer 21 manufacture with silicon oxide has Si—OH bonds. The Si—OH bonds can generate monomer self assembly with the silane reagent to form hydrophobic surfaces. The monomer film formed after the self assembly can be identified by observing the surface roughness and the density with the Scan Electron Microscope and the Atomic Force Microscope. Besides, the properties also can be found with the Scanning Tunneling Microscope or the infrared spectrum.

Furthermore, the groove structure can be employed for printing film formation of an organic function layer of an OLED display element, and the substrate 1 comprises a first electrode 11, and the dam 2 surrounding to form the groove 3 is located at periphery edges of the first electrode 11 and on the substrate 1, and the Hole Injection layer, the Emissive Layer and the Electron Transport Layer are manufacture in the dam 3, and a second electrode covers on the Electron Transport Layer. The first electrode 11 and the second electrode respectively are the anode and the cathode of the OLED display element.

step 4, baking and cleaning the substrate 1.

In conclusion, the present invention provides a groove structure employed for printing film formation, wherein the groove structure is located on a substrate, and comprises a dam and a groove formed by the dam surrounding, and the dam comprises at least two layers of branch dam layers, which are stacked up, and material of the branch dam layers is silicon nitride or silicon oxide, and materials of two layers of branch dam layers, which are adjacent, are different, and material of a top side branch dam layer is silicon oxide, and the inclined circumferential surface of the groove, which is surrounded by the branch dam layer manufactured with silicon oxide and the upper surface of the top side branch dam layer are covered with monomer silane reagent to become hydrophobic surfaces, and an inclined circumferential surface of the groove, which is surrounded by the branch dam layer manufactured with silicon nitride, is a hydrophilic surface. While performing printing film formation, the upper surface of the top side branch dam layer is hydrophobic to make that the ink can better get inside the groove, and does not remain on the surface. According to the different hydrophilic-hydrophobic properties of each layer of material ink, the surfaces having different hydrophilic-hydrophobic properties can be correspondingly selected to reasonably adjust the contact angle of the ink and the contact surface, and can prevent the nonuniform film thickness caused after the solvent evaporation. The present invention provides a manufacture method of a groove structure employed for printing film formation, in which with the surfaces of different hydrophilic-hydrophobic properties, the nonuniform film thickness caused after the solvent evaporation can be prevented.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A groove structure employed for printing film formation, wherein the groove structure is located on a substrate, and comprises a dam and a groove formed by the dam surrounding;
the dam comprises at least two layers of branch dam layers, which are stacked up;
material of the branch dam layers is silicon nitride or silicon oxide, and materials of two layers of branch dam layers, which are adjacent, are different, and material of a top side branch dam layer is silicon oxide;
an inclined circumferential surface of the groove, which is surrounded by the branch dam layer manufactured with silicon oxide, and an upper surface of the top side branch dam layer are hydrophobic surfaces and the inclined circumferential surface of the groove, which is surrounded by the branch dam layer manufactured with silicon oxide, and an upper surface of the top side branch dam layer are covered with monomer silane reagent;
an inclined circumferential surface of the groove, which is surrounded by the branch dam layer manufactured with silicon nitride, is a hydrophilic surface.

2. The groove structure employed for printing film formation according to claim 1, wherein the dam comprises four layers of branch dam layers, which are stacked up.

3. The groove structure employed for printing film formation according to claim 1, wherein the groove structure is employed for printing film formation of an organic function layer of an OLED (Organic Light Emitting Diode) display element, and the substrate comprises a first electrode, and the dam surrounding to form the groove is located at periphery edges of the first electrode and on the substrate.

4. A manufacture method of a groove structure employed for printing film formation, comprising steps of:
step 1, providing a substrate, and sequentially forming at least two layers of branch dam layers, which are stacked up on the substrate by coating, drying and etching to form a dam, and the dam surrounds to form a groove;
material of the branch dam layers is silicon nitride or silicon oxide, and materials of two layers of branch dam layers, which are adjacent, are different, and material of a top side branch dam layer is silicon oxide;
step 2, implementing oxygen plasma process to the respective branch dam layers to enhance hydrophilies of surfaces of the respective branch dam layers;
step 3, employing monomer silane reagent to implement monomer self assembly to the respective branch dam layers to make an inclined circumferential surface of the groove, which is surrounded by the branch dam layer manufactured with silicon oxide, and an upper surface of the top side branch dam layer become hydrophobic surfaces.

5. The manufacture method of the groove structure employed for printing film formation according to claim 4, wherein in the step 1, the substrate comprises a first electrode, and the dam surrounding to form the groove is located at periphery edges of the first electrode and on the substrate.

6. The manufacture method of the groove structure employed for printing film formation according to claim 4, wherein in the step 3, by positioning the substrate into a closed vessel, and vacuuming the closed vessel and then supplying silane reagent gas into the same to make monomer self assembly generate to the branch dam layer manufacture with silicon oxide and the silane reagent.

7. The manufacture method of the groove structure employed for printing film formation according to claim 4, wherein in the step 3, solution containing the silane reagent is drop coated on the substrate to make monomer self assembly generate to the branch dam layer manufacture with silicon oxide and the silane reagent.

8. The manufacture method of the groove structure employed for printing film formation according to claim 4, further comprising step 4, baking and cleaning the substrate.

9. A manufacture method of a groove structure employed for printing film formation, comprising steps of:
step 1, providing a substrate, and sequentially forming at least two layers of branch dam layers, which are stacked up on the substrate by coating, drying and etching to form a dam, and the dam surrounds to form a groove;
material of the branch dam layers is silicon nitride or silicon oxide, and materials of two layers of branch dam layers, which are adjacent, are different, and material of a top side branch dam layer is silicon oxide;
step 2, implementing oxygen plasma process to the respective branch dam layers to enhance hydrophilies of surfaces of the respective branch dam layers;
step 3, employing monomer silane reagent to implement monomer self assembly to the respective branch dam layers to make an inclined circumferential surface of the groove, which is surrounded by the branch dam layer manufactured with silicon oxide, and an upper surface of the top side branch dam layer become hydrophobic surfaces;
wherein in the step 1, the substrate comprises a first electrode, and the dam surrounding to form the groove is located at periphery edges of the first electrode and on the substrate;
step 4, baking and cleaning the substrate.

10. The manufacture method of the groove structure employed for printing film formation according to claim 9, wherein in the step 3, by positioning the substrate into a closed vessel, and vacuuming the closed vessel and then supplying silane reagent gas into the same to make monomer self assembly generate to the branch dam layer manufacture with silicon oxide and the silane reagent.

11. The manufacture method of the groove structure employed for printing film formation according to claim 9, wherein in the step 3, solution containing the silane reagent is drop coated on the substrate to make monomer self assembly generate to the branch dam layer manufacture with silicon oxide and the silane reagent.

* * * * *